US012764898B2

(12) United States Patent
Yin

(10) Patent No.: US 12,764,898 B2
(45) Date of Patent: Oct. 13, 2026

(54) FAN AND FAN MODULE WITH MODULAR ASSEMBLY STRUCTURE

(71) Applicant: PURPLE CLOUD DEVELOPMENT PTE. LTD., Singapore (SG)

(72) Inventor: Dachang Yin, Hui Zhou City (CN)

(73) Assignee: PURPLE CLOUD DEVELOPMENT PTE. LTD., Singapore (SG)

( * ) Notice: Subject to any disclaimer, the term of this patent is extended or adjusted under 35 U.S.C. 154(b) by 23 days.

(21) Appl. No.: 19/208,889

(22) Filed: May 15, 2025

(65) Prior Publication Data

US 2025/0358952 A1 Nov. 20, 2025

(30) Foreign Application Priority Data

May 16, 2024 (CN) ........................ 202421080572.0

(51) Int. Cl.
*H05K 7/20* (2006.01)

(52) U.S. Cl.
CPC ................................ *H05K 7/20172* (2013.01)

(58) Field of Classification Search
CPC . H05K 7/20172; F04D 29/601; F04D 29/646; F04D 25/06; F04D 25/08; F04D 25/166; G06F 1/20
See application file for complete search history.

(56) References Cited

U.S. PATENT DOCUMENTS

| | | | | |
|---|---|---|---|---|
| 2023/0038370 | A1* | 2/2023 | Fang | H05K 7/20172 |
| 2023/0188001 | A1* | 6/2023 | Melo, Jr. | F04D 25/08 |
| 2024/0396261 | A1* | 11/2024 | Fang | H01R 13/6205 |

FOREIGN PATENT DOCUMENTS

| | | | | | |
|---|---|---|---|---|---|
| CN | 101832278 | A | | 9/2010 | |
| CN | 206180226 | U | * | 5/2017 | |
| CN | 113944902 | A | | 1/2022 | |
| CN | 117553037 | A | * | 2/2024 | H01R 13/73 |
| TW | M285198 | U | | 1/2006 | |

* cited by examiner

*Primary Examiner* — Courtney D Heinle
(74) *Attorney, Agent, or Firm* — Merchant & Gould P.C.

(57) ABSTRACT

A plurality of fans for use in a fan module that is configured to allow tool-free assembly and disassembly, at least one of the fans includes either a first connector and a second connector, two first connectors, or two second connectors, where the first connector and the second connector are complementary. The first connector includes a plurality of conductive pins, and the second connector includes a plurality of contact foils. The first connector of the fan is coupled to the second connector of an adjacent fan to establish both electrical and mechanical connections between the adjacent fans. An external power connector includes either the first connector or the second connector. The external power connector is coupled to a complementary connector of an outermost fan body to supply power to the fan module.

18 Claims, 10 Drawing Sheets

FAN AND FAN MODULE WITH MODULAR ASSEMBLY STRUCTURE

CROSS-REFERENCE TO RELATED APPLICATIONS

This application is a non-provisional and claims priority under 35 U.S.C. § 119 to China Application No. 202421080572.0, filed May 16, 2024, the contents are thereby incorporated by reference in their entirety.

TECHNICAL FIELD

The present disclosure relates to the field of thermal management tools, and more particularly to a fan and fan module designed for convenient assembly and disassembly.

BACKGROUND

Fans are widely used in applications requiring thermal dissipation, particularly in electronic devices with high heat concentration. Traditional fans are typically manufactured as standalone units with fixed dimensions and specifications. When the application requires higher cooling capacity, it usually needs to increase the number of fans based on specific thermal demands. However, conventional standalone fans each require independent power connections, resulting in multiple power wires. Accordingly, it leads to cable clutter, difficulties in cable routing, a limited number of available connectors, and so forth.

Chinese Utility Model Patent No. CN 218563952 U, titled "Modular Fan Facilitating Assembly," discloses a modular fan system comprising a fan body and an assembly module. The assembly module includes sockets, boundary connectors, central connectors, and connecting wires. Multiple fan bodies can be quickly connected and utilized in parallel through plug-in assembly, with the connecting wires enabling parallel power supply across the units.

While this design offers improved modularity, it still has multiple shortcomings. First, the mechanical connection between multiple fan bodies is insufficiently robust, resulting in instability. Second, when not in use, the central connector is separated from the fan body, making it difficult to store and easily misplaced, rendering it inconvenient. In view of the above, the present disclosure provides a fan that allows for more secure and convenient assembly and disassembly, with an objective of addressing the shortcomings of existing designs.

SUMMARY

In general terms, this disclosure is directed to Fan and Fan Module with Modular Assembly Structure thereof. In some embodiments, and by non-limiting example, the present disclosure provides fans and at least a fan module that are easy to assemble and disassemble. According to the embodiments, the fan module includes two or more fans assembled in sequence and an external power connector.

One aspect of the present disclosure provides a fan module. The fan module includes a plurality of fans coupled together in series, at least one of the fans having a fan body that includes either a first connector and a second connector, two first connectors, or two second connectors, where the first connector and the second connector are complementary, and wherein: the first connector includes a plurality of conductive pins, the second connector includes a plurality of contact foils, and the first connector of one fan body is coupled to the second connector of an adjacent fan body to establish both electrical and mechanical connections between adjacent fan bodies, and an external power connector having either the first connector or the second connector, the external power connector being coupled to a complementary connector of an outermost fan body to supply power to the fan module.

In one embodiment, the conductive pin is a POGO pin.

In one embodiment, the contact foil is made of copper.

In one embodiment, the first connector further comprises a protruding base and a first printed circuit board (PCB), the protruding base having a latching end, and the conductive pin being disposed on the protruding base and electrically connected to the first PCB.

In one embodiment, the second connector further comprises a recess and a second PCB, the recess being configured to receive the protruding base, a limiting channel being formed on a sidewall of the recess to engage the latching end, and the contact foils being disposed on the second PCB, where the latching end is received in the limiting channel and the conductive pin is pressed against the contact foils when the adjacent fan bodies are assembled.

In one embodiment, the limiting channel comprises a longitudinal open section and a lateral closed section, and when the adjacent fan bodies are assembled side-by-side, the latching end of the protruding base enters the limiting channel via the longitudinal open section and is retained in the lateral closed section.

In one embodiment, the conductive pins are arranged side-by-side.

In one embodiment, the contact foils are arranged in a fan-shaped distribution.

In one embodiment, the conductive pin comprises a pin shaft, a barrel electrically connected to the first PCB, and a spring disposed between the pin shaft and the barrel, such that the pin shaft contacts and is pressed against the contact foil when the adjacent fan bodies are assembled.

In one embodiment, the fan body comprises a fan frame that includes a wire-retaining groove, fan blades, and a motor electrically connected to the first PCB, the second PCB, or both, via a power wire.

Another aspect of the present disclosure provides a plurality of fans for use in a fan module that is configured to allow tool-free assembly and disassembly. At least one of the fans includes either a first connector and a second connector, two first connectors, or two second connectors, where the first connector and the second connector are complementary, and wherein: the first connector includes a plurality of conductive pins, the second connector includes a plurality of contact foils, and the first connector of the fan is coupled to the second connector of an adjacent fan to establish both electrical and mechanical connections between the adjacent fans.

This summary is provided to introduce a selection of concepts in a simplified form that are further described below in the Detailed Description. This summary is not intended to identify key features or essential features of the claimed subject matter, nor is it intended to be used to limit the scope of the claimed subject matter.

DETAILED DESCRIPTION

Figure 1:
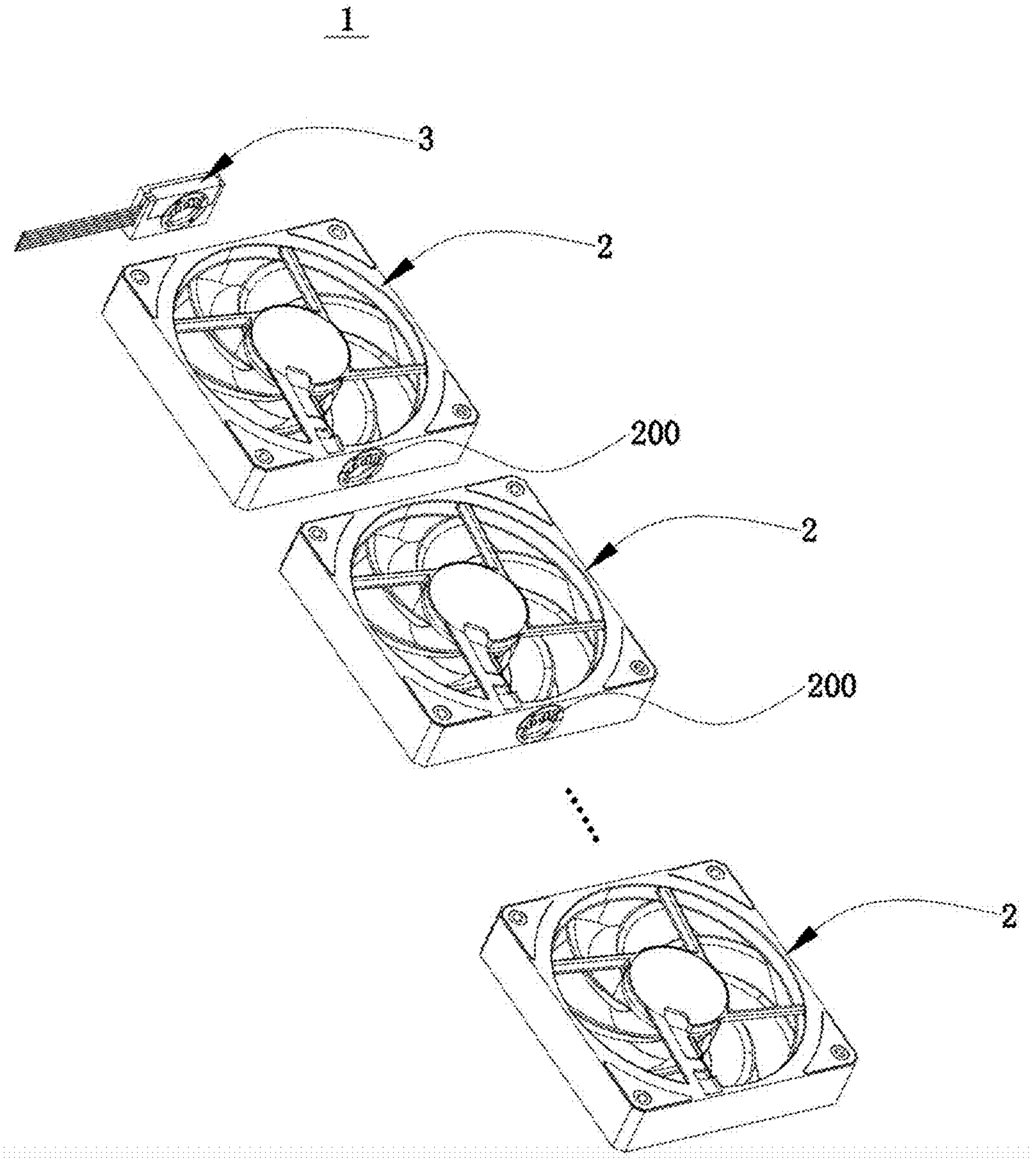
FIG. 1 is a partial structural schematic diagram of a fan module including multiple fans according to one embodiment of the present invention.

Various embodiments will be described in detail with reference to the drawings, wherein like reference numerals represent like parts and assemblies throughout the several views. Reference to various embodiments does not limit the scope of the claims attached hereto. Additionally, any examples set forth in this specification are not intended to be limiting and merely set forth some of the many possible embodiments for the appended claims.

Referring to FIG. 1. FIG. 1 is a partial structural schematic diagram of a fan module including multiple fans in accordance with one embodiment of the present invention. As an example illustrated in FIG. 1, the fan module 1 includes at least three fans 2, which are sequentially assembled.

In one embodiment, for each pair of adjacent fans 2, one fan includes a first connector 100 (see FIG. 2) and the other includes a second connector 200. The first connector 100 of one adjacent fan is configured to mechanically and electrically engage the second connector 200 of the other adjacent fan 2, thereby establishing both mechanical coupling and electrical continuity between the two adjacent fans 2.

In one embodiment, when the fan module 1 includes more than three fans 2, each of the intermediate fans, i.e., those positioned between the two outermost fans, is configured to interface with both of its adjacent fans. To maintain uninterrupted mechanical and electrical connections throughout the fan module 1, each intermediate fan is provided with both a first connector 100 and a second connector 200, two first connectors 100, or two second connectors 200.

Figure 2:
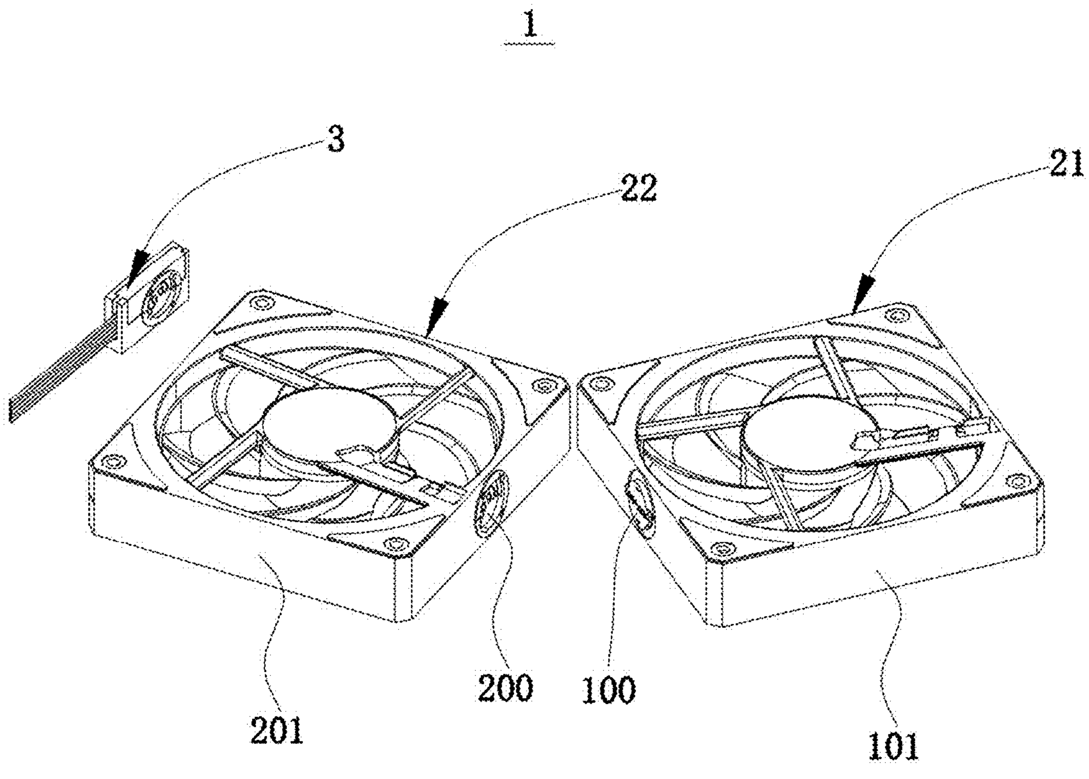
FIG. 2 is a schematic diagram of the unassembled state of a fan module including two fans according to one embodiment of the present invention.
Figure 3:
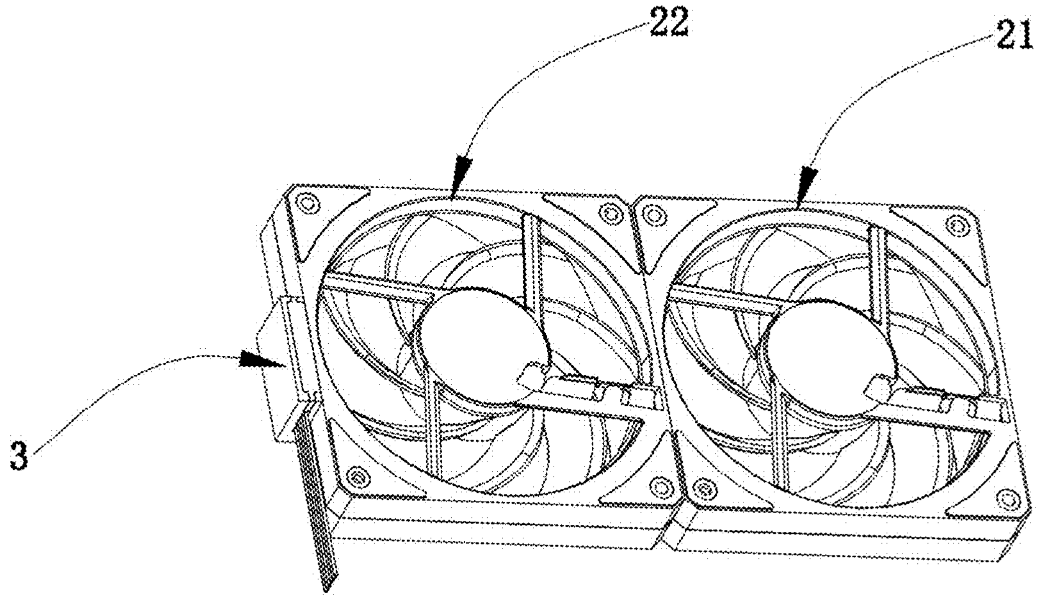
FIG. 3 is a schematic diagram of the assembled state of the fan module shown in FIG. 2.

Referring to FIGS. 2 and 3. FIG. 2 is a schematic diagram of the unassembled state of a fan module including two fans in accordance with one embodiment of the present invention. FIG. 3 is a schematic diagram of the assembled state of the fan module shown in FIG. 2. As an example illustrated in FIG. 3, the fan module 1 includes two fans that are assembled together. For example, the two fans are referred to as a first fan 21 and a second fan 22. The first fan 21 includes a first fan body 101, and the second fan 22 includes a second fan body 201.

In one embodiment, the side of the first fan body 101 that faces the second fan body 202 is provided with a first connector 100. Similarly, the side of the second fan body 201 that faces the first fan body 101 is provided with a second connector 200. The first connector 100 and the second connector 200 are configured to engage with one another, thereby establishing mechanical and electrical connections between the first fan 21 and the second fan 22 when assembled.

Figure 4:
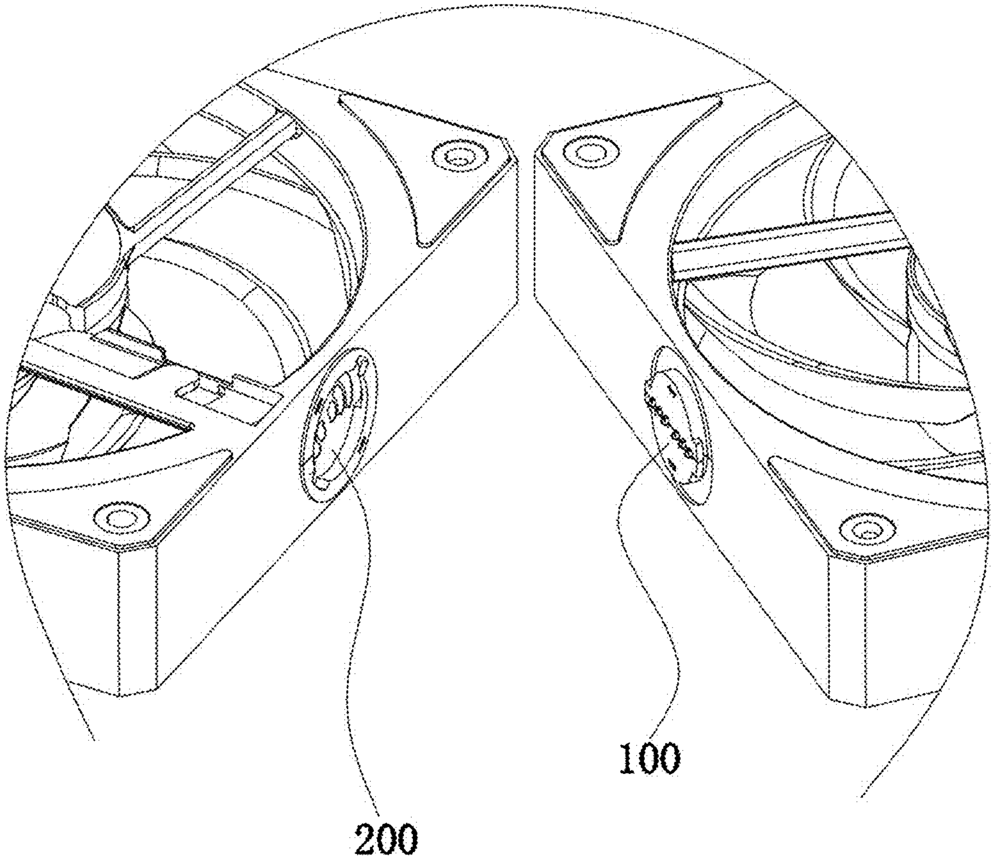
FIG. 4 is a partially enlarged view of FIG. 2.
Figure 5:
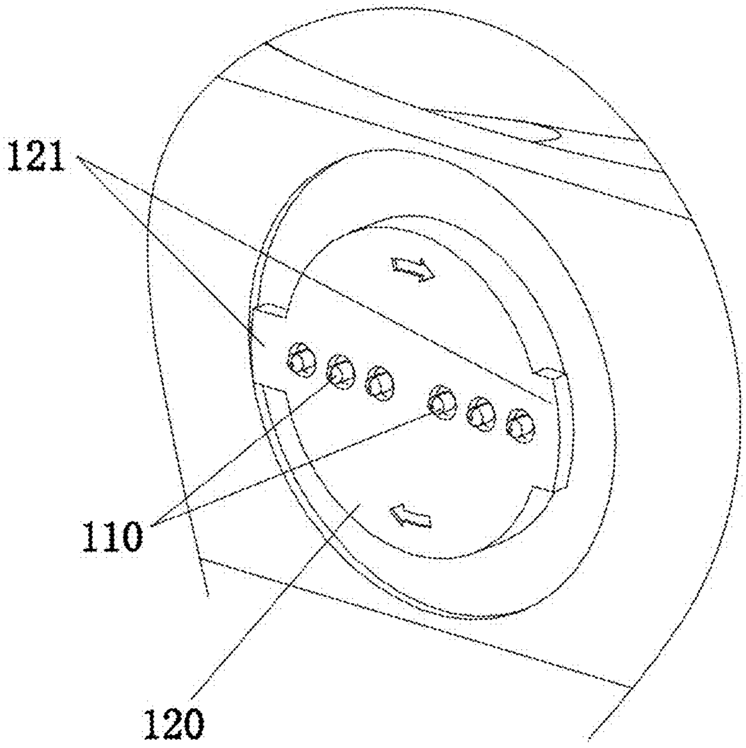
FIG. 5 is a structural schematic diagram of a first connector shown in FIG. 2.
Figure 6:
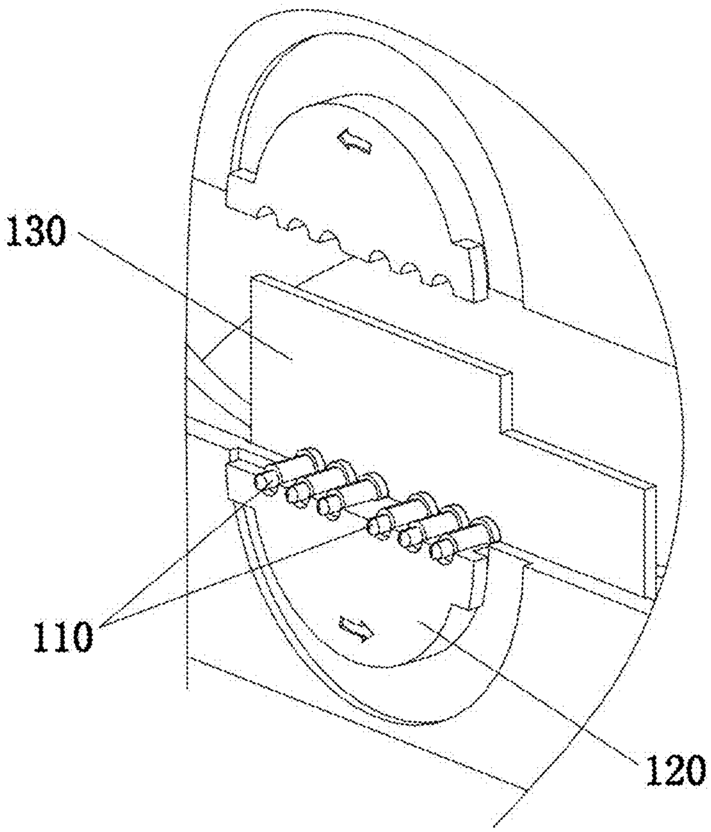
FIG. 6 is an exploded view of the first connector shown in FIG. 4.
Figure 7:
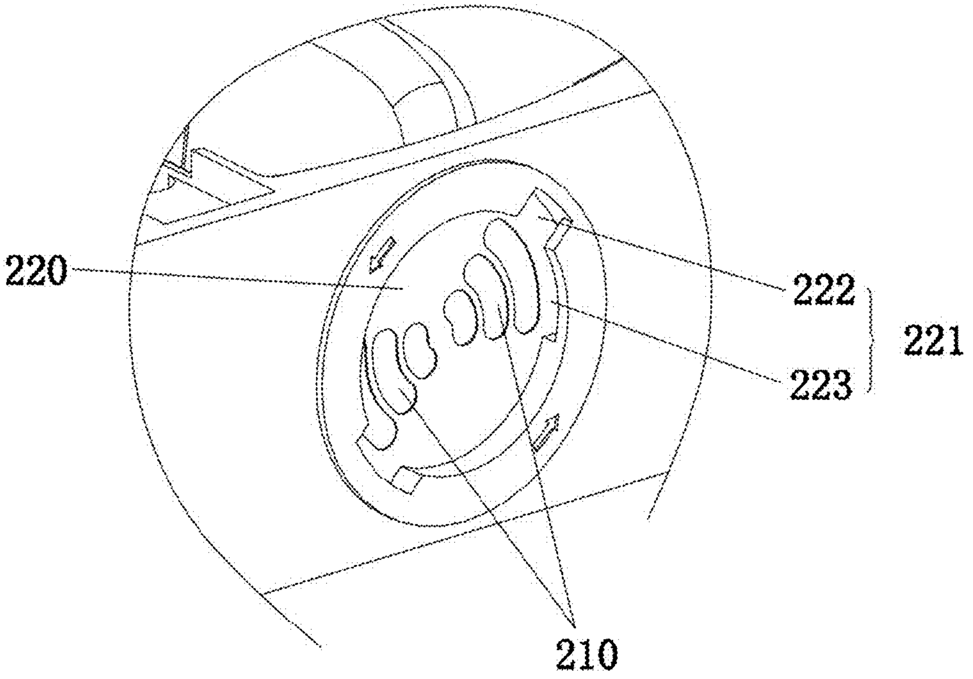
FIG. 7 is a structural schematic diagram of a second connector shown in FIG. 2.

Referring to FIGS. 4-7. FIG. 4 is a partially enlarged view of FIG. 2. FIG. 5 is a structural schematic diagram of a first connector shown in FIG. 2. FIG. 6 is an exploded view of the first connector shown in FIG. 4. FIG. 7 is a structural schematic diagram of a second connector shown in FIG. 2.

As an example illustrated in FIGS. 4 and 5, the first connector 100 includes a plurality of first conductive structures. In one embodiment, the first conductive structures are implemented as conductive pins 110. For example, the conductive pins 110 are POGO pins (also referred to spring-loaded pins). However, the embodiment is not limited thereto. In other embodiments, the number of first conductive structures may be one or two, and alternative types of the first conductive structures may be used depending on the specific application requirements.

As an example illustrated in FIGS. 5 and 6, the first connector 100 further includes a protrusion base 120 and a first printed circuit board (PCB) 130. The protrusion base 120 is provided with a latching end 121. In one embodiment, the conductive pins 110 are mounted on the protrusion base 120 and electrically connected to the first PCB 130, thereby enabling electrical communication between the conductive pins 110 and the circuitry of the first PCB 130.

As an example illustrated in FIGS. 4 and 7, the second connector 200 includes a plurality of second conduction structures. In one embodiment, the second conductive structures are implemented as contact foils 210. However, the embodiment is not limited thereto. In other embodiments, the number of second conductive structures may be one or two, and alternative types of the second conductive structures may be used depending on the specific application requirements.

Figure 8:
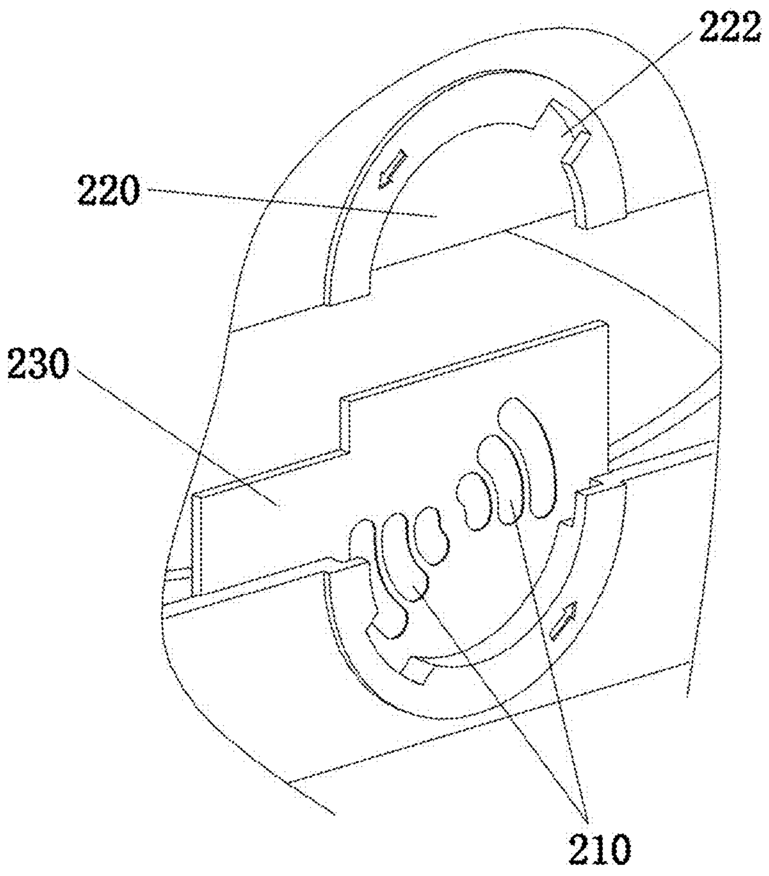
FIG. 8 is an exploded view of the second connector shown in FIG. 4.

Referring to FIG. 8 along with FIGS. 5 and 7. FIG. 8 is an exploded view of the second connector. As an example illustrated in FIGS. 7 and 8, the second connector 200 further includes a recess 220 and a second printed circuit board (PCB) 230.

In one embodiment, the recess 220 is configured to receive the protrusion base 120. For example, a limiting channel 221 is formed on the sidewall of the recess 220 and is shaped to engage with the latching end 121 of the protrusion base 120. In one embodiment, the contact foils 210 are disposed on the second PCB 230 and are configured to interface with the conductive pins 110. For example, when the conductive pins 110 connect with the contact foils 210, electrical connection is established between the first fan body 101 and the second fan body 201.

In one embodiment, when the first fan 21 and the second fan 22 are assembled, the first connector 100 and the second connector 200 engage with one another. Specifically, the latching end 121 of the protrusion base 120 is inserted into and secured within the limiting channel 221, and the conductive pins 110 press against the contact foils 210. The mechanical engagement between the latching end 121 and the limiting channel 221 secures the protrusion base 120 within the recess 220, thereby ensuring a stable mechanical connection between the two fan units. Simultaneously, the contact between the conductive pins 110 and the contact foils 210 establishes an electrical connection, avoiding the power supply issue between the assembled fan units. In other words, an external power source connected to one of the outermost fan bodies can supply power to the other fan bodies through the electrical interfaces established between them.

According to the embodiment, the limiting channel 221 includes a longitudinal open section 222 and a lateral closed section 223. When the first fan body 101 and the second fan body 201 are assembled side-by-side, the latching end 121 of the protrusion base 120 enters the limiting channel 221 via the longitudinal open section 222 and is retained in the lateral closed section 223. The detailed latching process will be described below.

As an example illustrated in FIGS. 5 and 7, a plurality of conductive pins 110 are provided, arranged side-by-side. Correspondingly, a plurality of contact foils 210 are also provided. The contact foils 210 are radially arranged in a fan-shaped pattern around the center of the recess 220. In one embodiment, the contact foils 210 are arranged in two fan-shaped sections symmetrically positioned around the center. However, the embodiment is not limited thereto. In other embodiments, the contact foils can be arranged in other geometric configurations, such as concentric circles, spiral patterns, or irregular radial arrays, depending on the desired contact area and mechanical design constraints.

In one embodiment, when the first fan 21 and the second fan 22 are assembled, the multiple conductive pins 110 come into contact with the corresponding contact foils 210 in a one-to-one manner. Further, due to the fan-shaped distribution of the contact foils 210, the effective contact area for the conductive pins 110 is enlarged, thereby enhancing the reliability and stability of the electrical connection between the first fan 21 and the second fan 22.

Figure 9:
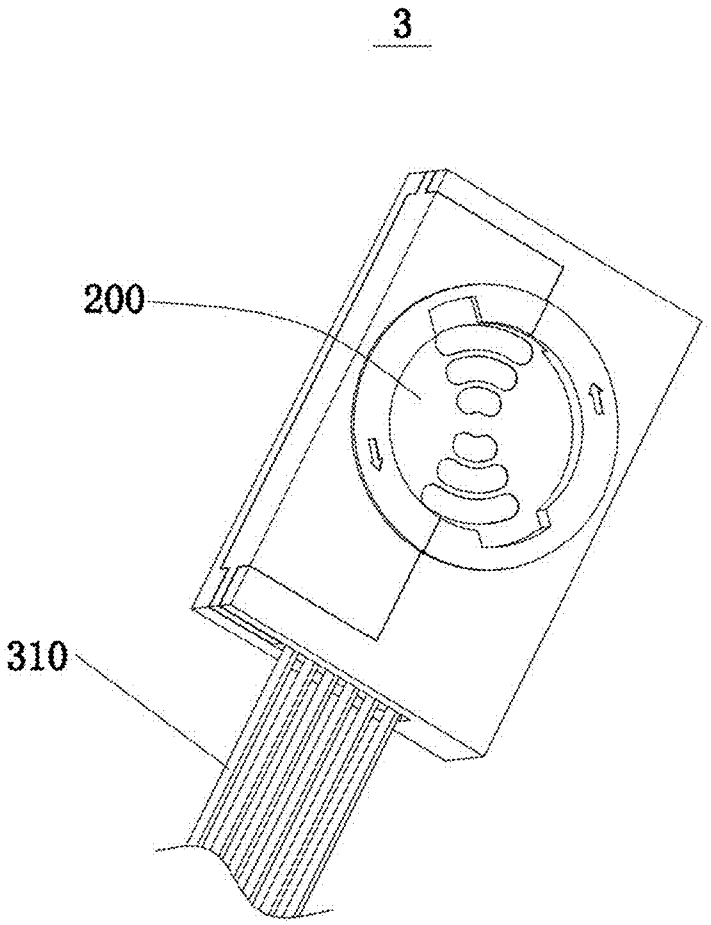
FIG. 9 is a structural schematic diagram of an external power connector shown in FIG. 2.

Referring to FIG. 9 along with FIG. 3. FIG. 9 is a structural schematic diagram of an external power connector shown in FIG. 2. As an example illustrated in FIG. 9, an external power connector 3 includes the second connector 200. In other examples, the external power connector can also include the first connector.

In one embodiment, the second connector 200 of the external power connector 3 is both mechanically and electrically connected to the first connector (not shown) of the second fan 22. In another embodiment, the external power connector 3 can be mechanically and electrically connected to the first fan 21. For example, the first fan 21 includes a corresponding first connector that interfaces with the second connector 200 of the external power connector 3.

In one embodiment, the external power connector 3 includes an external power cable 310, which is electrically connected to the second PCB 230 (as shown in FIG. 8) of the second connector 200. During operation, the external power connector 3 is connected to an external power source (not shown) via an external power cable 310 supplying power to the fan module 1. In another embodiment, the external power connector 3 can include the first connector. Accordingly, the first connector of the external power connector 3 is both mechanically and electrically connected to the adjacent fan's second connector.

Figure 10:
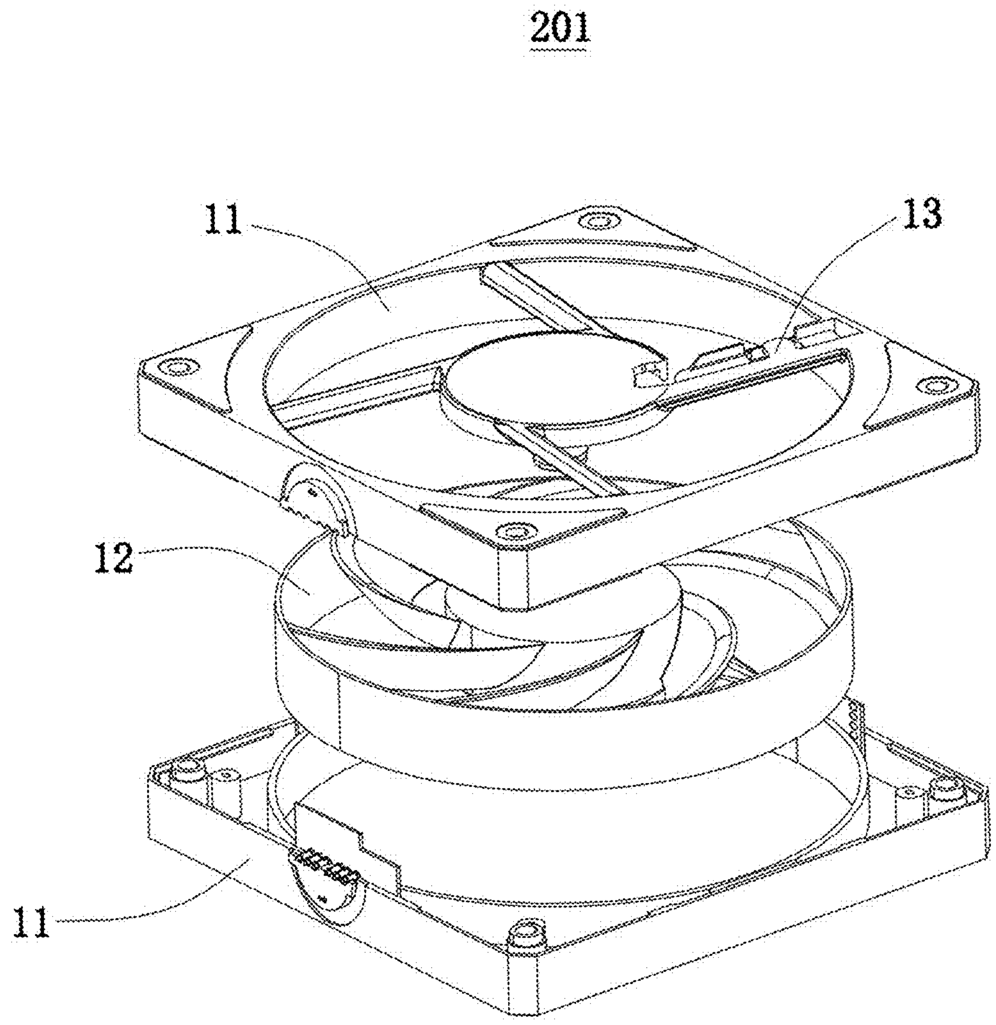
FIG. 10 is an exploded view of the first fan body of the present utility model.

Referring to FIG. 10. FIG. 10 is an exploded view of the second fan body of the present utility model. As an example illustrated in FIG. 10, the second fan body 201 includes a fan frame 11, fan blades 12, and a motor (not shown). The motor is electrically connected to either the first PCB (as shown in FIG. 6), the second PCB (as shown in FIG. 8), or both, via a power wire (not shown). A wire-routing groove 13 is formed on the fan frame 11 for securing the power wire in place. It should be note that the first fan body (as shown in FIG. 2) also includes a fan frame, fan blades, and a motor. Similarly, the motor is connected to the first PCB and/or the second PCB via a power wire, and a wire-routing groove is provided on the fan frame to secure the power wire.

The operation principle of the fan module 1 in accordance with this embodiment is detailed below with reference to the structural features described above.

During assembly of the fan module 1, the first connector 100 of the first fan 21 is aligned with the second connector 200 of the second fan 22, such that the protrusion base 120 is positioned opposite the recess 220. At this state, the second fan 22 is tilted relative to the first fan 21 to align the latching end 121 with the longitudinal open section 222 of the limiting channel 221. The second fan 22 is then moved closer to the first fan 21, allowing the protrusion base 120 to enter the recess 220. Accordingly, the latching end 121 slides into the longitudinal open section 222, and the conductive pin 110 is pressed into contact with the contact foil 210.

Subsequently, the second fan 22 is rotated (alternatively, the first fan 21 may be rotated instead) so that it becomes parallel with the first fan 21. The rotation causes the latching end 121 to move from the longitudinal open section 222 into the lateral closed section 223 of the limiting channel 221. Once rotated into alignment, the latching end 121 is securely locked within the limiting channel 221, and the protrusion base 120 is stably seated within the recess 220, forming a solid mechanical connection between the two fans. Meanwhile, the conductive pin 110 remains continuously engaged with the contact foil 210, ensuring a stable electrical connection between the two fan units.

Similarly, the external power connector 3 can be coupled to the first connector 100 of the second fan 22 using the same rotational latching method. External power is supplied through the external power connector 3 and sequentially delivered to the second fan 22 and the first fan 21.

To disassemble the fan module 1, the user simply rotates the second fan 22 in the reverse direction (or rotates the first fan 21 in the reverse direction), causing the latching end 121 to move from the lateral closed section 223 back into the longitudinal open section 222. The latching end 121 can then be disengaged and removed from the recess 220 to separate the two fans. Once removed, the conductive pin 110 no longer maintains in contact with the contact foil 210, and the electrical connection between the fans is disengaged.

The fan module 1 in accordance with the embodiments above provides numerous advantageous effects including but not limited to the following technical features.

In the beginning, the first connector 100 and the second connector 200 are configured to engage via a rotational latching mechanism. After assembly, the latch end 121 can endure axial external forces, whereas the protrusion base 120 can withstand radial forces. The design effectively addresses the issue of unreliable or unstable connections commonly encountered in conventional fan assembly.

Moreover, the electrical connection between the two fans is achieved through direct contact between the conductive pins 110 and the contact foils 210. The configuration eliminates the need for separate connectors or cables, simplifying the assembly while also reducing the risk of losing detachable components.

In addition, the contact foils 210 are arranged in a fan-shaped (sector) layout, thereby expanding the effective contact area for the conductive pins 110. Accordingly, the electrical circuit can be completed as soon as the first connector 100 and the second connector 200 are engaged. The design not only enhances the electrical connection reliability, but it also improves heat dissipation due to the increased surface area of the contact foils 210.

Furthermore, the conductive pins 110 employ a POGO pin structure to ensure a more stable and reliable electrical connection with the contact foils 210. Specifically, each conductive pin 110 includes a plunger (pin shaft), a barrel, and a spring positioned between them (not shown). The barrel is electrically connected to the first PCB 130. In the assembled configuration of the fan module, the spring is compressed, and the plunger is pressed against the contact foil 210 on the second PCB 230. The spring maintains the plunger remains firmly pressed against the contact foil 210, ensuring reliable and high-quality electrical contact.

In one embodiment, the contact foils 210 are made of copper, and the surface of the plunger of the conductive pins 110 is gold-plated. The copper structure of the contact foils 210 provides excellent electrical conductivity and thermal dissipation capacities, and the gold plating on the conductive pins enhances corrosion resistance, mechanical durability, and electrical performance.

Therefore, the fan and fan module of the present disclosure are easy to assemble and disassemble. The design of the present disclosure also ensures stable mechanical and electrical interconnection between multiple fans. Furthermore, the design reduces the number of separate components, improving user convenience and reducing the likelihood of part loss or connection failure.

Therefore, embodiments disclosed herein are well adapted to attain the ends and advantages mentioned as well as those that are inherent therein. The particular embodiments disclosed above are illustrative only, as the embodiments disclosed may be modified and practiced in different but equivalent manners apparent to those of ordinary skill in the relevant art having the benefit of the teachings herein. Furthermore, no limitations are intended to the details of construction or design herein shown, other than as described in the claims below. It is therefore evident that the particular illustrative embodiments disclosed above may be altered, combined, or modified and all such variations are considered within the scope and spirit of the present disclosure. Of course, the disclosed embodiments are merely exemplary embodiments and that various modifications can be made without departing from the spirit and scope of the disclosure. Further, it should be understood that various aspects of the embodiment are not mutually exclusive of each other and can be combined as desired by a person of ordinary skill in the art as a matter of design choices.

The embodiments illustratively disclosed herein suitably may be practiced in the absence of any element that is not specifically disclosed herein and/or any optional element disclosed herein. While compositions and methods are described in terms of "comprising," "containing," or "including" various components or steps, the compositions and methods can also "consist essentially of" or "consist of" the various components and steps. All numbers and ranges disclosed above may vary by some number. Whenever a numerical range with a lower limit and an upper limit is disclosed, any number and any included range falling within the range is specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an," as used in the claims, are defined herein to mean one or more than one of the elements that it introduces.

What is claimed is:

1. A fan module, comprising:

a plurality of fan bodies coupled together in series, each fan body having two connectors, each connector being either a first connector or a second connector, wherein:

the first connector includes a plurality of conductive pins, the second connector includes a plurality of contact foils that are radially arranged in a fan-shaped pattern around a central axis, the first connector and the second connector are complementary, such that mating the first connector with the second connector establishes both electrical and mechanical connections, and for each pair of adjacent fan bodies, a first connector of one of the adjacent fan bodies is mated with a complementary second connector of the other one of the adjacent fan bodies; and an external power connector having one of the first connector or the second connector, the external power connector being amated with a complementary connector of an outermost one of the fan bodies to supply power to the fan module.

2. The fan module of claim 1, wherein each of the conductive pins is a POGO pin.

3. The fan module of claim 1, wherein each of the contact foils is made of copper.

4. The fan module of claim 1, wherein the first connector further comprises a protruding base and a first printed circuit board (PCB), the protruding base having a latching end, and each of the conductive pins being disposed on the protruding base and electrically connected to the first PCB.

5. The fan module of claim 4, wherein the second connector further comprises a recess and a second PCB, the recess being configured to receive the protruding base, a limiting channel being formed on a sidewall of the recess to engage the latching end, and the contact foils being disposed on the second PCB, where the latching end is received in the limiting channel and each of the conductive pins is pressed against a corresponding contact foil when the adjacent fan bodies are assembled.

6. The fan module of claim 5, wherein the limiting channel comprises a longitudinal open section and a lateral closed section, and when the adjacent fan bodies are assembled side-by-side, the latching end of the protruding base enters the limiting channel via the longitudinal open section and is retained in the lateral closed section.

7. The fan module of claim 1, wherein the conductive pins are arranged side-by-side.

8. The fan module of claim 4, wherein each of the conductive pins comprises a pin shaft, a barrel electrically connected to the first PCB, and a spring disposed between the pin shaft and the barrel, such that the pin shaft contacts and is pressed against a contact foil of the second connector when the adjacent fan bodies are assembled.

9. The fan module of claim 5, wherein the fan body comprises a fan frame that includes a wire-retaining groove, fan blades, and a motor electrically connected to the first PCB, the second PCB, or both, via a power wire.

10. A plurality of fans for use in a fan module that is configured to allow tool-free assembly and disassembly, each of the fans comprising:

two connectors, each connector being either a first connector or a second connector, wherein:

the first connector includes a plurality of conductive pins, the second connector includes a plurality of contact foils that are radially arranged in a fan-shaped pattern around a central axis, the first connector and the second connector are complementary, such that mating the first connector with the second connector establishes both electrical and mechanical connections, and for each pair of adjacent fans, a first connector of one of the adjacent fans is mated with a complementary second connector of the other one of the adjacent fans.

11. The fan of claim 10, wherein each the conductive pins is a POGO pin.

12. The fan of claim 10, wherein each of the contact foils is made of copper.

13. The fan of claim 10, wherein the first connector further comprises a protruding base and a first printed circuit board (PCB), the protruding base having a latching end, and each of the conductive pins being disposed on the protruding base and electrically connected to the first PCB.

14. The fan of claim 13, wherein the second connector further comprises a recess and a second PCB, the recess being configured to receive the protruding base, a limiting channel being formed on a sidewall of the recess to engage the latching end, and the contact foil being disposed on the second PCB, where the latching end is received in the limiting channel and each of the conductive pins is pressed against a corresponding contact foil when the adjacent fan are assembled.

15. The fan of claim 14, wherein the limiting channel comprises a longitudinal open section and a lateral closed section, and when the adjacent fan is assembled side-by-side, the latching end of the protruding base enters the limiting channel via the longitudinal open section and is retained in the lateral closed section.

16. The fan of claim 10, wherein the conductive pins are arranged side-by-side.

17. The fan of claim 13, wherein each of the conductive pins comprises a pin shaft, a barrel electrically connected to the first printed circuit board, and a spring disposed between the pin shaft and the barrel, such that the pin shaft contacts and is pressed against a contact foil of the second connector when the adjacent fan is assembled.

18. The fan of claim 14, further comprises a fan frame that includes a wire-retaining groove, fan blades, and a motor electrically connected to the first PCB, the second PCB, or both, via a power wire.

* * * * *